(12) United States Patent
Cao

(10) Patent No.: US 10,677,971 B2
(45) Date of Patent: Jun. 9, 2020

(54) ORGANIC THIN FILM STRUCTURE AND METHOD FOR MANUFACTURING SAME

(71) Applicant: Shenzhen China Star Optoelectronics Semiconductor Display Technology Co., Ltd., Shenzhen (CN)

(72) Inventor: Wu Cao, Shenzhen (CN)

(73) Assignee: Shenzhen China Star Optoelectronics Semiconductor Display Technology Co., Ltd., Shenzhen (CN)

(*) Notice: Subject to any disclaimer, the term of this patent is extended or adjusted under 35 U.S.C. 154(b) by 80 days.

(21) Appl. No.: 15/572,512

(22) PCT Filed: Nov. 1, 2017

(86) PCT No.: PCT/CN2017/108864
§ 371 (c)(1),
(2) Date: Nov. 8, 2017

(87) PCT Pub. No.: WO2019/056504
PCT Pub. Date: Mar. 28, 2019

(65) Prior Publication Data
US 2019/0094607 A1 Mar. 28, 2019

(51) Int. Cl.
G02B 5/22 (2006.01)
G02B 5/20 (2006.01)
G02F 1/1335 (2006.01)
G02F 1/1333 (2006.01)
G03F 7/00 (2006.01)
G03F 7/095 (2006.01)
(Continued)

(52) U.S. Cl.
CPC ............ *G02B 5/223* (2013.01); *G02B 5/201* (2013.01); *G02B 5/226* (2013.01);
(Continued)

(58) Field of Classification Search
CPC ......... G02B 5/20–289; G02F 1/133509; G02F 1/133512; G02F 1/133514;
(Continued)

(56) References Cited

U.S. PATENT DOCUMENTS 4,564,584 A * 1/1986 Fredericks .......... H01L 21/0274
430/312
6,569,604 B1 * 5/2003 Bhatt ................ H01L 23/49816
257/E23.067
(Continued)

FOREIGN PATENT DOCUMENTS

CN 104749674 7/2015
CN 106125500 11/2016
(Continued)

OTHER PUBLICATIONS

English machine translation of JP-58218119-A (Year: 1983).*

Primary Examiner — Nicholas R. Pasko

(57) ABSTRACT

An organic thin film structure is formed on a surface of a glass substrate. At least two color resist blocks are formed by patterning. A recess is formed between the two adjacent color resist blocks. Each of the color resist blocks has a lower color resist layer and an upper color resist layer formed on a surface of the lower color resist layer. A boundary of the upper color resist layer and a boundary the lower color resist layer are connected, and an angle between the boundaries and the surface of the glass substrate ranges from 10° to 60°.

2 Claims, 2 Drawing Sheets

(52) U.S. Cl.
CPC .. *G02F 1/133512* (2013.01); *G02F 1/133516* (2013.01); *G02F 2001/133302* (2013.01); *G03F 7/0007* (2013.01); *G03F 7/095* (2013.01)

(58) Field of Classification Search
CPC ........... G02F 1/133516; G02F 2201/08; G03F 7/0007; G03F 7/0035; G03F 7/095; G03F 7/0952; G03F 7/0955; G03F 7/0957; H01L 27/322
USPC ....... 359/359, 360, 580–590, 885, 887, 890, 359/891; 349/106; 430/312
See application file for complete search history.

(56) References Cited

U.S. PATENT DOCUMENTS

| | | | | |
|---|---|---|---|---|
| 7,303,856 B2* | 12/2007 | Sato | ...................... | G03F 7/0955 430/273.1 |
| 7,704,648 B2* | 4/2010 | Su | .......................... | G02B 5/204 430/7 |
| 8,993,218 B2* | 3/2015 | Yang | ....................... | G03F 7/095 430/270.1 |
| 2007/0020439 A1* | 1/2007 | Yamamoto | ................ | B32B 3/00 428/172 |
| 2016/0370646 A1* | 12/2016 | Nishiyama | ................ | G03F 7/11 |
| 2017/0090247 A1* | 3/2017 | Lee | ................... | G02F 1/133617 |
| 2018/0210282 A1* | 7/2018 | Song | ................. | G02F 1/133536 |

FOREIGN PATENT DOCUMENTS

| | | | | |
|---|---|---|---|---|
| CN | 106873237 | | 6/2017 | |
| JP | 58-218119 | | 12/1983 | |
| JP | 58218119 A | * | 12/1983 | .............. G03F 7/095 |
| JP | 2002-033273 | | 1/2002 | |

* cited by examiner

ORGANIC THIN FILM STRUCTURE AND METHOD FOR MANUFACTURING SAME

RELATED APPLICATIONS

This application is a National Phase of PCT Patent Application No. PCT/CN2017/108864 having International filing date of Nov. 1, 2017, which claims the benefit of priority of Chinese Patent Application No. 201710866779.9 filed on Sep. 22, 2017. The contents of the above applications are all incorporated by reference as if fully set forth herein in their entirety.

FIELD AND BACKGROUND OF THE INVENTION

The present invention relates to displays, and particularly to an organic thin film structure and a method for manufacturing the organic thin film structure.

Black photo spacer (BPS)/black column spacer (BCS) technology is defined as using one material to form structures of a black matrix (BM) and a photo spacer (PS) and integrate two processes. A plurality of different structures and processes are made from mask plates with different transmittances. BPS 1 Tone technology is defined as using mask plates with transmittances ranging from 0 to 100% and patterning an organic photosensitive resin with black dye. PS and BM with different height are formed by a gasket with a certain height made of other materials. 1 Tone technology has a lower cost for manufacturing the mask plates and has a low demand for materials of BPS (particularly to a sensitivity of light), and therefore has better application prospects.

In the pixel structure, the BM crosses over scan lines or data lines of an array substrate, because the mask plate of 1 Tone without a translucence region of a half tone mask (HTM), BPS film has a higher height, the height of the BPS film is more than 3 um, and a BM block is formed and affects liquid crystal forming process with polyimide (PI) and performance of liquid crystal flow.

SUMMARY OF THE INVENTION

The application mainly provides a color film substrate, a recess is defined between two adjacent color resist blocks of the color film substrate, a slant angle of a bottom of the color resist block is reduced, a flat boundary of the color resist block/the BM is defined, and a thickness of the BM film is reduced; solving technical problems is that the BPS film has a large thickness, and a BM block is formed and affects liquid crystal forming process with polyimide (PI) and performance of liquid crystal flow.

For the above-mentioned objective, the present disclosure employs the following technical schemes.

An organic thin film structure, comprising an organic thin film layer formed on a surface of a glass substrate; wherein at least two color resist blocks are formed by patterning the organic thin film layer; and a recess is formed between the two color resist blocks;

each of the color resist blocks comprising:

a lower color resist layer formed on the surface of the glass substrate; and an upper color resist layer formed on a surface of the lower color resist layer, wherein material of the lower color resist layer has a different photosensitivity value from material of the upper color resist layer;

wherein both a cross-sectional pattern of the lower color resist layer and a cross-sectional pattern of the upper color resist layer are polygonal; a total inclination angle of the color resist block defined between a boundary connected between the upper color resist layer and the lower color resist layer and the surface of the glass substrate ranges from 10° to 60°.

In one exemplary embodiment, in the organic thin film structure, the total inclination angle of the color resist block is 30°.

In one exemplary embodiment, in the organic thin film structure, a length of a bottom edge of the upper color resist layer is less than a length of an upper edge of the lower color resist layer;

a length of an upper edge of the upper color resist layer is less than the length of the bottom edge of the upper color resist layer; and an angle between the bottom edge of the upper color resist layer and a sloping side of the upper color resist layer is equal to an angle between the bottom edge of the lower color resist layer and a sloping side of the lower color resist layer.

In one exemplary embodiment, in the organic thin film structure, a length of a bottom edge of the upper color resist layer is equal to a length of an upper edge of the lower color resist layer;

a length of an upper edge of the upper color resist layer is less than the length of the bottom edge of the upper color resist layer; and an angle between the bottom edge of the upper color resist layer and a sloping side of the upper color resist layer is less than an angle between the bottom edge of the lower color resist layer and a sloping side of the lower color resist layer.

In one exemplary embodiment, in the organic thin film structure, the angle between the bottom edge of the upper color resist layer and the sloping side of the upper color resist layer is 30°, and the angle between the bottom edge of the lower color resist layer and the sloping side of the lower color resist layer is 30°.

In one exemplary embodiment, in the organic thin film structure, a light shielding layer is formed on a surface of the organic thin film layer, a light shielding line is formed by patterning the light shielding layer, the light shielding line is formed in the recess between the two color resist blocks, and covers a portion of a surface of the color resist block.

An organic thin film structure, comprising an organic thin film layer formed on a surface of a glass substrate; wherein at least two color resist blocks are formed by patterning the organic thin film layer; and a recess is formed between the two color resist blocks;

each of the color resist blocks comprising:

a lower color resist layer formed on the surface of the glass substrate; and an upper color resist layer formed on a surface of the lower color resist layer;

wherein both a cross-sectional pattern of the lower color resist layer and a cross-sectional pattern of the upper color resist layer are polygonal; a total inclination angle of the color resist block defined between a boundary connected between the upper color resist layer and the lower color resist layer and the surface of the glass substrate ranges from 10° to 60°.

In one exemplary embodiment, in the organic thin film structure, the total inclination angle of the color resist block is 30°.

In one exemplary embodiment, in the organic thin film structure, a length of a bottom edge of the upper color resist layer is less than a length of an upper edge of the lower color resist layer;

a length of an upper edge of the upper color resist layer is less than the length of the bottom edge of the upper color resist layer; and an angle between the bottom edge of the upper color resist layer and a sloping side of the upper color resist layer is equal to an angle between the bottom edge of the lower color resist layer and a sloping side of the lower color resist layer.

In one exemplary embodiment, in the organic thin film structure, a length of a bottom edge of the upper color resist layer is equal to a length of an upper edge of the lower color resist layer;

a length of an upper edge of the upper color resist layer is less than the length of the bottom edge of the upper color resist layer; and an angle between the bottom edge of the upper color resist layer and a sloping side of the upper color resist layer is less than an angle between the bottom edge of the lower color resist layer and a sloping side of the lower color resist layer.

In one exemplary embodiment, in the organic thin film structure, the angle between the bottom edge of the upper color resist layer and the sloping side of the upper color resist layer is 30°, and the angle between the bottom edge of the lower color resist layer and the sloping side of the lower color resist layer is 30°.

In one exemplary embodiment, in the organic thin film structure, a light shielding layer is formed on a surface of the organic thin film layer, a light shielding line is formed by patterning the light shielding layer, the light shielding line is formed in the recess between the two color resist blocks, and covers a portion of a surface of the color resist block.

A method for manufacturing an organic thin film, wherein the method comprising:

a step S510 of providing a glass substrate;

a step S520 of forming an organic thin film layer on a surface of the glass substrate, and forming at least two color resist blocks by patterning the organic thin film layer;

a step S520 of comprising:

a step S5201 of forming a first organic thin film layer on the surface of the glass substrate;

a step S5202 of forming a second organic thin layer on a surface of the first organic thin film layer; and material of the first organic thin film layer having a different photosensitivity value from material of the second organic thin layer; and a step S5203 of forming a lower color resist layer and an upper color resist layer of the color resist block by a single exposure process in the first organic thin film layer and the second organic thin layer; and a step S530 of defining a total inclination angle of the color resist block between a boundary connected between the upper color resist layer and the lower color resist layer and the surface of the glass substrate, the total inclination angle of the color resist block ranging from 10° to 60°.

In one exemplary embodiment, in the method for manufacturing the organic thin film, in the step S5203, a length of a bottom edge of the upper color resist layer is less than a length of an upper edge of the lower color resist layer;

a length of an upper edge of the upper color resist layer is less than the length of the bottom edge of the upper color resist layer; and an angle between the bottom edge of the upper color resist layer and a sloping side of the upper color resist layer is equal to an angle between the bottom edge of the lower color resist layer and a sloping side of the lower color resist layer.

In one exemplary embodiment, in the method for manufacturing the organic thin film, in the step S5203, a length of a bottom edge of the upper color resist layer is equal to a length of an upper edge of the lower color resist layer;

a length of an upper edge of the upper color resist layer is less than the length of the bottom edge of the upper color resist layer; and an angle between the bottom edge of the upper color resist layer and a sloping side of the upper color resist layer is less than an angle between the bottom edge of the lower color resist layer and a sloping side of the lower color resist layer.

The beneficial effect of this invention is: compared with the prior art organic thin film structure, in this application, a recess is formed between two adjacent color resist blocks made from organic thin films, a slant angle of a bottom of the color resist block is reduced, an opening of the recess is enlarged, a shape of the recess is improved to increase a flatness of a light shielding layer of the color resist block, reduce a thickness of the light shielding layer, and obtain the light shielding layer with a thin thickness and a flat surface and solve technical problems is that the BPS film has a large thickness, and a BM block is formed and affects liquid crystal forming process with polyimide (PI) and performance of liquid crystal flow.

BRIEF DESCRIPTION OF THE SEVERAL VIEWS OF THE DRAWINGS

In order to describe clearly the embodiment in the present disclosure or the prior art, the following will introduce the drawings for the embodiment shortly. Obviously, the following description is only a few embodiments, for the common technical personnel in the field it is easy to acquire some other drawings without creative work.

DESCRIPTION OF SPECIFIC EMBODIMENTS OF THE INVENTION

Figure 1:
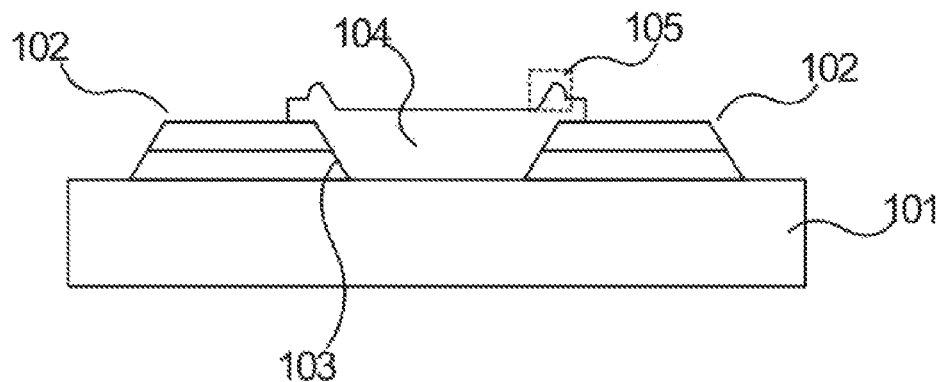
FIG. 1 is one structure diagram of an organic thin film of the present disclosure.

The description of following embodiment, with reference to the accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to the orientation of the accompanying drawings. Therefore, the used directional terms are intended to illustrate, but not to limit, the present disclosure. In the drawings, the components having similar structures are denoted by same numerals.

The application solves technical problems that the BPS film has a large thickness, and a BM block is formed and affects liquid crystal forming process with polyimide (PI) and performance of liquid crystal flow.

Referring to FIG. 1, an organic thin film structure is provided in this application and is formed on a surface of a glass substrate 101. At least two color resist blocks 102 are formed by patterning the organic thin film layer. A recess 103 is formed between the two color resist blocks 102. For one example, the glass substrate 101 is a base substrate of a color film substrate of a liquid crystal display panel. Each color resist block 102 is formed on a surface of the base substrate of the color film substrate. For other one example, the color resist block 102 is formed on a surface of an array substrate of the liquid crystal display panel.

A light shielding layer is formed on a surface of the organic thin film layer. A light shielding line 104 is formed by patterning the light shielding layer. The light shielding line 104 is formed in the recess 103 between the two color resist blocks 102, and covers a portion of a surface of the color resist block 102. The light shielding layer is coated on the surface of the organic thin film layer. Materials of the light shielding layer fill into the recess 103 and overflows on a surface of the recess 103. The light shielding line 104 is formed by patterning the light shielding layer and covers a portion of a surface of the color resist block 102 and forms a horned protrusion 105.

A height of the protrusion 105 is too high to affect the liquid crystal forming process with polyimide (PI) and performance of liquid crystal flow. In order to reduce the height of the protrusion 105 effectively, and a shape of the color resist block 102 is changed. The color resist block 102 comprises a lower color resist layer formed on the surface of the glass substrate 101 and an upper color resist layer formed on a surface of the lower color resist layer. Both of a cross-sectional pattern of the lower color resist layer and a cross-sectional pattern of the upper color resist layer are polygonal. A total inclination angle of the color resist block 102 is defined between a boundary connected between the upper color resist layer and the lower color resist layer and the surface of the glass substrate 101. The total inclination angle of the color resist block 102 ranges from 10° to 60°.

Figure 2:
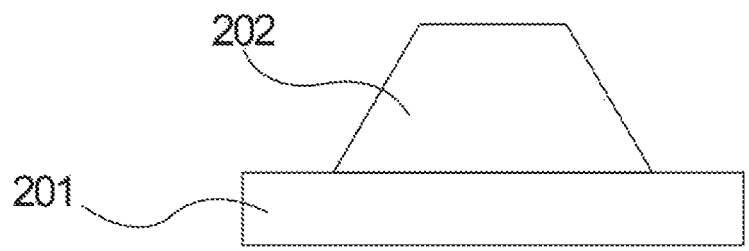
FIG. 2 is other one structure diagram of an organic thin film of the present disclosure.

Referring to FIG. 2, a structure diagram of an organic thin film of the present disclosure is provided. The organic thin film is formed on a surface of a glass substrate 201. The organic thin film is a single layer color resist block.

A cross-sectional pattern of the color resist block 202 is an isosceles trapezoidal. The cross-sectional pattern of the color resist block 202 comprises an upper edge, a lower edge and a sloping side connected between the upper edge and the lower edge. A lower bottom angle of the color resist block 202 being an angle between the sloping side and the bottom edge ranges from 10° to 60°.

First Exemplary Embodiment

Figure 3:
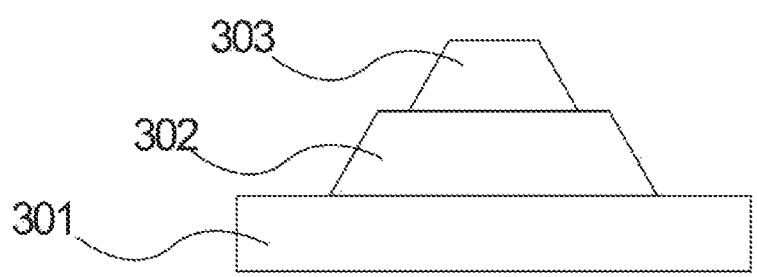
FIG. 3 is a structure diagram of an organic thin film according to a first exemplary embodiment of the present disclosure.

Referring to FIG. 3, the organic thin film structure provided in this application is formed on a surface of a glass substrate 301. The color resist blocks are formed by patterning the organic thin film layer.

The color resist block is defined as composite layers. The composite layers comprises a lower color resist layer 302 formed on the surface of the glass substrate 301 and an upper color resist layer 303 formed on a surface of the lower color resist layer 302. The lower color resist layer 302 and the upper color resist layer 303 are made of photosensitive materials. Material of the lower color resist layer 302 has a different photosensitivity value from material of the upper color resist layer 303. After a single exposure process, a slant angle of the upper color resist layer is different from a slant angle of the lower color resist layer to reduce a total inclination angle of the color resist block and to increase a flatness of a light shielding layer of the color resist block and reduce the height of the protrusion.

A length of the bottom edge of a cross-sectional pattern of the upper color resist layer 303 is less than a length of an upper edge of a cross-sectional pattern of the lower color resist layer 302. A length of an upper edge of the cross-sectional pattern of the upper color resist layer 303 is less than the length of the bottom edge of the cross-sectional pattern of the upper color resist layer 303. An angle between the bottom edge of the cross-sectional pattern of the upper color resist layer 303 and a sloping side is equal to an angle between the bottom edge of the cross-sectional pattern of the lower color resist layer 302 and a sloping side.

For example, the angle between the bottom edge of the cross-sectional pattern of the lower color resist layer 302 and the sloping side is 60°, and the angle between the bottom edge of the cross-sectional pattern of the upper color resist layer 303 and the sloping side is 60°.

The lower color resist layer 302 is arranged on the surface of the upper color resist layer 303. A cross-sectional pattern of a combination of the lower color resist layer 302 and the upper color resist layer 303 is a step graphics to increase an opening of the recess and to buffer materials in depositing, a flow rate of materials is slow to avoid materials to be overheated in depositing.

The total inclination angle of the color resist block 102 is smaller, an area of the opening of the recess is larger, and the flatness of the light shielding layer of the color resist block is larger.

For example, the bottom angle of the color resist block is a minimum angle of 10° to increase an area of the color resist block occupied by the light shielding layer and reduce an aperture ratio, to solve the above problem, a distance between two adjacent color resist layer 202 can be reduce to make the cross-sectional pattern of the recess being close to an inverted triangle and to increase a light transmitting area of the color resist block 202.

Further example, the bottom angle of the color resist block is a larger angle of 60° to reduce the area of the color resist block occupied by the light shielding layer, but the flatness of surface is generally expressed.

And further example, the bottom angle of the color resist block is 30° to be better control the area of the color resist block occupied by the light shielding layer and the flatness of the surface of the light shielding layer.

Second Exemplary Embodiment

Figure 4:
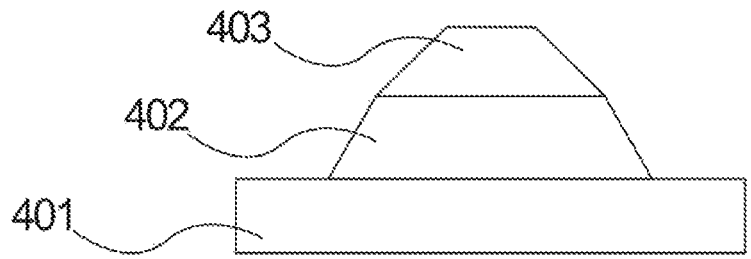
FIG. 4 is a structure diagram of an organic thin film according to a second exemplary embodiment of the present disclosure.

Referring to FIG. 4, the organic thin film structure provided in this application is formed on a surface of a glass substrate 401. The color resist blocks are formed by patterning the organic thin film layer The color resist block is defined as composite layers. The composite layers comprises a lower color resist layer 402 formed on the surface of the glass substrate 401 and an upper color resist layer 403 formed on a surface of the lower color resist layer 402. A cross-sectional pattern of the lower color resist layer 402 and A cross-sectional pattern of the upper color resist layer 403 are isosceles trapezoids.

Comparing with the first exemplary embodiment, the difference as below: a length of the bottom edge of a cross-sectional pattern of the upper color resist layer 403 is equal to a length of an upper edge of a cross-sectional pattern of the lower color resist layer 402. A length of an upper edge of the cross-sectional pattern of the upper color resist layer 403 is less than the length of the bottom edge of the cross-sectional pattern of the upper color resist layer 403. An angle between the bottom edge of the cross-sectional pattern of the upper color resist layer 403 and a sloping side is less than an angle between the bottom edge of the cross-sectional pattern of the lower color resist layer 402 and a sloping side.

Both of this exemplary embodiment and the first exemplary embodiment can be better to control the surface flatness of the light shielding layer and to reduce the height of the protrusion of the light shielding layer.

Figure 5:
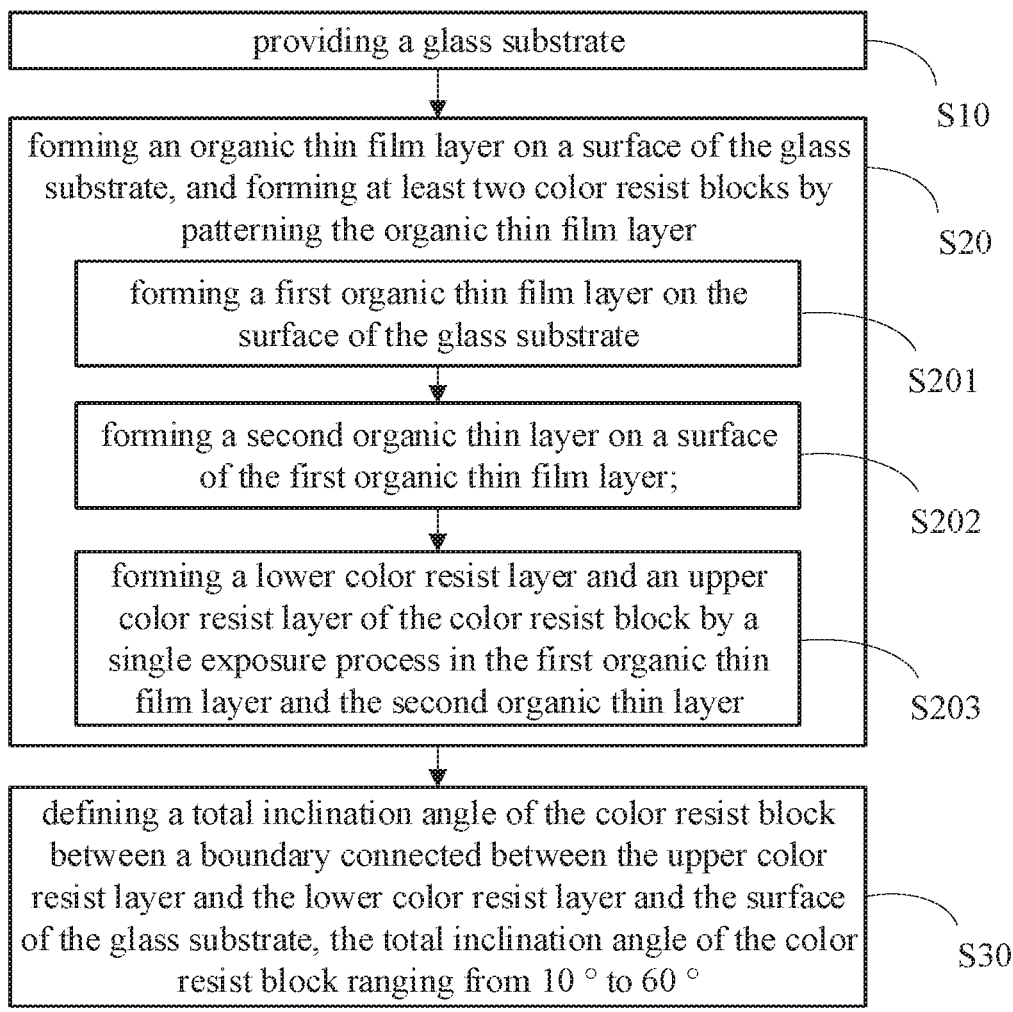
FIG. 5 is a flowchart of a method for manufacturing an organic thin film of the present disclosure.

Referring to FIG. 5, according to the above exemplary embodiments, a method for manufacturing a color film substrate, the method comprises:

a step S510 of providing a glass substrate;

a step S520 of forming an organic thin film layer on a surface of the glass substrate, and forming at least two color resist blocks by patterning the organic thin film layer;

a step S520 of comprising:

a step S5201 of forming a first organic thin film layer on the surface of the glass substrate;

a step S5202 of forming a second organic thin layer on a surface of the first organic thin film layer; and material of the first organic thin film layer having a different photosensitivity value from material of the second organic thin layer; and a step S5203 of forming a lower color resist layer and an upper color resist layer of the color resist block by a single exposure process in the first organic thin film layer and the second organic thin layer; and a step S530 of defining a total inclination angle of the color resist block between a boundary connected between the upper color resist layer and the lower color resist layer and the surface of the glass substrate, the total inclination angle of the color resist block ranging from 10° to 60°.

The beneficial effect of this invention is: compared with the prior art organic thin film structure, in this application, a recess is formed between two adjacent color resist blocks made from organic thin films, a slant angle of a bottom of the color resist block is reduced, an opening of the recess is enlarged, a shape of the recess is improved to increase a flatness of a light shielding layer of the color resist block, reduce a thickness of the light shielding layer, and obtain the light shielding layer with a thin thickness and a flat surface and solve technical problems is that the BPS film has a large thickness, and a BM block is formed and affects liquid crystal forming process with polyimide (PI) and performance of liquid crystal flow.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. An organic thin film structure, comprising an organic thin film layer formed on a surface of a glass substrate and a light shielding layer formed on a surface of the organic thin film layer; wherein the organic thin film layer comprises at least two color resist blocks; and a recess is formed between the two color resist blocks;

each of the color resist blocks comprising:
a lower color resist layer formed on the surface of the glass substrate; and
an upper color resist layer formed on a surface of the lower color resist layer, wherein material of the lower color resist layer has a different photosensitivity value from material of the upper color resist layer;
wherein both a cross-sectional pattern of the lower color resist layer and a cross-sectional pattern of the upper color resist layer are polygonal; the light shielding layer comprises a light shielding line, the light shielding line is formed in the recess between the two color resist blocks, and covers a portion of a surface of the color resist block, a length of a bottom edge of the upper color resist layer is equal to a length of an upper edge of the lower color resist layer; a length of an upper edge of the upper color resist layer is less than the length of the bottom edge of the upper color resist layer; and an angle between the bottom edge of the upper color resist layer and a sloping side of the upper color resist layer is less than an angle between the bottom edge of the lower color resist layer and a sloping side of the lower color resist layer.

2. An organic thin film structure, comprising an organic thin film layer formed on a surface of a glass substrate and a light shielding layer formed on a surface of the organic thin film layer; wherein the organic thin film layer comprises at least two color resist blocks; and a recess is formed between the two color resist blocks;

each of the color resist blocks comprising:
a lower color resist layer formed on the surface of the glass substrate; and
an upper color resist layer formed on a surface of the lower color resist layer;
wherein both a cross-sectional pattern of the lower color resist layer and a cross-sectional pattern of the upper color resist layer are polygonal; the light shielding layer comprises a light shielding line, the light shielding line is formed in the recess between the two color resist blocks, and covers a portion of a surface of the color resist block, a length of a bottom edge of the upper color resist layer is equal to a length of an upper edge of the lower color resist layer; a length of an upper edge of the upper color resist layer is less than the length of the bottom edge of the upper color resist layer; and an angle between the bottom edge of the upper color resist layer and a sloping side of the upper color resist layer is less than an angle between the bottom edge of the lower color resist layer and a sloping side of the lower color resist layer.

* * * * *

UNITED STATES PATENT AND TRADEMARK OFFICE
CERTIFICATE OF CORRECTION

| | |
|---|---|
| PATENT NO. | : 10,677,971 B2 |
| APPLICATION NO. | : 15/572512 |
| DATED | : June 9, 2020 |
| INVENTOR(S) | : Wu Cao |

It is certified that error appears in the above-identified patent and that said Letters Patent is hereby corrected as shown below:

On the Title Page

Insert the following:
-- (30) *Foreign Application Priority Data*
Sep. 22, 2017 (CN) ...................... 201710866779.9 --

Signed and Sealed this
Twenty-second Day of September, 2020

Andrei Iancu
*Director of the United States Patent and Trademark Office*